US005206877A

United States Patent [19]

Kahen

[11] Patent Number: 5,206,877

[45] Date of Patent: Apr. 27, 1993

[54] DISTRIBUTED FEEDBACK LASER DIODES WITH SELECTIVELY PLACED LOSSY SECTIONS

[75] Inventor: Keith B. Kahen, Rochester, N.Y.

[73] Assignee: Eastman Kodak Company, Rochester, N.Y.

[21] Appl. No.: 836,568

[22] Filed: Feb. 18, 1992

[51] Int. Cl.[5] .......... H01S 3/08; H01S 3/19

[52] U.S. Cl. .......... 372/96; 372/45; 372/48

[58] Field of Search .......... 372/96, 45, 46, 48, 372/102

[56] References Cited

U.S. PATENT DOCUMENTS 4,835,779 5/1989 Liou .......... 372/96
4,903,275 2/1990 Ettenberg et al. .......... 372/48
4,932,034 6/1990 Usami et al. .......... 372/96
5,084,894 1/1992 Yamamoto .......... 372/96

FOREIGN PATENT DOCUMENTS 0125992 5/1989 Japan .......... 372/96

OTHER PUBLICATIONS

K. Aiki et al, "GaAs-GaAlAs distributed-feedback diode lasers with separate optical and carrier confinement", Appl. Phys. Lett., vol. 27, pp. 145-146 (1975).

H. Namikazi, M. K. Shams, and S. Wang, "Large-optical-cavity GaAs-(GaAl)As injection laser with low--loss distributed Bragg reflectors", Appl. Phys. Lett., vol. 31, pp. 122-124 (1977).

D. Anderson, R. August, and J. Coker, "Distributed-Feedback Double-Heterostructure GaAs Injection Laser with Fundamental Grating", Applied Optics, vol. 13, pp. 2742-2744 (1974).

*Primary Examiner*—Georgia Y. Epps

*Attorney, Agent, or Firm*—Raymond L. Owens

[57] ABSTRACT

A distributed-feedback semiconductor laser diode includes a patterned electrically conductive layer deposited on a capping layer, selectively forming a lossy section, such that electrical contact is absent for a small longitudinal section of the capping layer.

8 Claims, 3 Drawing Sheets

INTENSITY
1.0
0.8
0.6
0.4
0.2
0.0
DISTANCE (μm)
0
50
100
150
200
250
300
350
400

DISTRIBUTED FEEDBACK LASER DIODES WITH SELECTIVELY PLACED LOSSY SECTIONS

FIELD OF THE INVENTION

The present invention relates to distributed feedback laser diodes.

BACKGROUND OF THE INVENTION

Typically, semiconductor laser diodes are stable at a particular wavelength over a very narrow range of temperatures, i.e., approximately a few degrees. The reason for this instability is that a number of adjacent longitudinal modes all have approximately the same threshold gain (lasers operate at the wavelength with the smallest net threshold gain). In order to circumvent this problem, laser diodes have been developed which favor longitudinal modes of specific wavelengths. These types of laser diodes are generically called, frequency stabilized laser (FSL) diodes. The two main types of FSL diodes are distributed feedback (DFB) laser diodes (K. Aiki et al., "GaAs-AlGaAs distributed-feedback diode lasers with separate optical and carrier confinement, " Appl. Phys. Lett., vol. 27, pp. 145–146, 1975) and distributed Bragg reflector (DBR) laser diodes (H. Namikazi, M. K. Shams, and S. Wang, "Large-optical-cavity GaAs-(GaAl)As injection laser with low-loss distributed Bragg reflectors" Appl. Phys. Lett., vol. 31, pp. 122–124, 1977). The basic operating principle of these laser diodes is that for a very narrow range of wavelengths (called DFB modes) adjacent to the Bragg wavelength, $\lambda_B$ (see FIG. 1) optical feedback is provided not only by the end-facet mirrors (the Fabry-Perot modes), but also by a periodic variation of the index of refraction along the longitudinal length of the laser. For an ordinary semiconductor laser diode, which only has Fabry-Perot modes, the threshold gain is approximately uniform for nearby wavelengths; whereas, FIG. 1 shows that for a DFB laser diode with a third-order grating, there is approximately a 17% difference between the gain of the mode with the smallest threshold gain and that of its neighbor. Since DFB laser diodes have a larger modulation in the threshold gain compared to that of typical semiconductor laser diodes, these laser diodes exhibit a greater wavelength stability with respect to temperature (on the order of 50° C.). In order to improve the temperature stability, it is necessary to increase the modulation in the threshold gain. The modulation depth can be improved either by increasing the losses of the Fabry-Perot modes with respect to the DFB modes or by selectively decreasing the losses of the DFB modes. The former approach was taken by Anderson et al. (D. Anderson, R. August, and J. Coker, "Distributed-feedback injection laser with fundamental grating," Applied optics, vol. 13, pp. 2742–2744, 1974), who intentionally tilted the end-facet mirrors relative to each other by sawing (resulting in damaged facets), which lead to a substantial increase in the threshold gain modulation depth. However, this approach is not tenable for manufacturing since damaging part of the optical cavity results in a considerable shortening of the lifetime of lasers and higher threshold currents. Another typical method for increasing the Fabry-Perot losses is to place anti-reflection coatings on the end-facet mirrors. However, this method has the disadvantage of resulting in competition between the transverse electric (TE) and transverse magnetic (TM) DFB modes, giving rise to multimode laser diode operation. The latter approach of selectively decreasing the losses of the DFB modes is typically obtained by increasing the depth of the grating, i.e., resulting in a larger index of refraction variation along the longitudinal length of the laser diode. This approach also has its concomitant problems, such as, difficulty in reproducibly obtaining the same grating depth and an increase in the asymmetry of the output beam.

SUMMARY OF THE INVENTION

The object of this invention is to provide an improved DFB laser diode that solves both problems.

This object is achieved by a distributed-feedback semiconductor laser diode comprising:

(a) a semiconductor substrate of a first conductivity type;

(b) a lower cladding layer of such first conductivity type deposited on the semiconductor substrate;

(c) a semiconductor active layer formed on the lower cladding layer;

(d) a barrier layer of a second conductivity type deposited on the semiconductor active layer;

(e) a grating layer of such second conductivity type deposited on the barrier layer;

(f) an upper cladding layer of such second conductivity type deposited on the grating layer;

(g) a capping layer of such second conductivity type formed on the upper cladding layer;

(h) an electrically conductive layer formed on the substrate; and (i) a patterned electrically conductive layer deposited on the capping layer, selectively forming a lossy section, such that electrical contact is absent for a small longitudinal section of the capping layer.

In accordance with this invention, the modulation of the threshold gain is increased by incorporating selectively a small lossy (unpumped) section into the laser-diode cavity, which introduces large losses for the Fabry-Perot modes, but small losses for the DFB modes. The optimum position for the lossy section is at a minimum for the intensity distribution of the DFB modes. FIG. 2 plots the calculated relative intensity distribution as a function of longitudinal length for a third-order DFB grating and shows that the minimum of the intensity is at approximately 320 μm, for a 400 μm laser diode cavity. (Note that for typical semiconductor laser diodes with only Fabry-Perot modes, the intensity distribution is approximately uniform across the length of the laser cavity with a value of 0.9.) For a 5 μm lossy section placed at the intensity minimum, the calculated modulation of the threshold gain increases from 17% to 45%, almost a factor of three improvement. (The calculation assumes a 0.1 μm GaAs active layer, whose computed unpumped absorption loss is 3000 $cm^{-1}$.) This improvement occurs without any of the disadvantages noted for the schemes employed in the prior art.

DETAILED DESCRIPTION OF THE PREFERRED EMBODIMENTS

According to the preferred embodiment, a DFB laser diode is constructed by incorporating selectively a small lossy section along its longitudinal length, thus resulting in an increase in the threshold gain modulation depth of the DFB laser diode.

Figure 3:
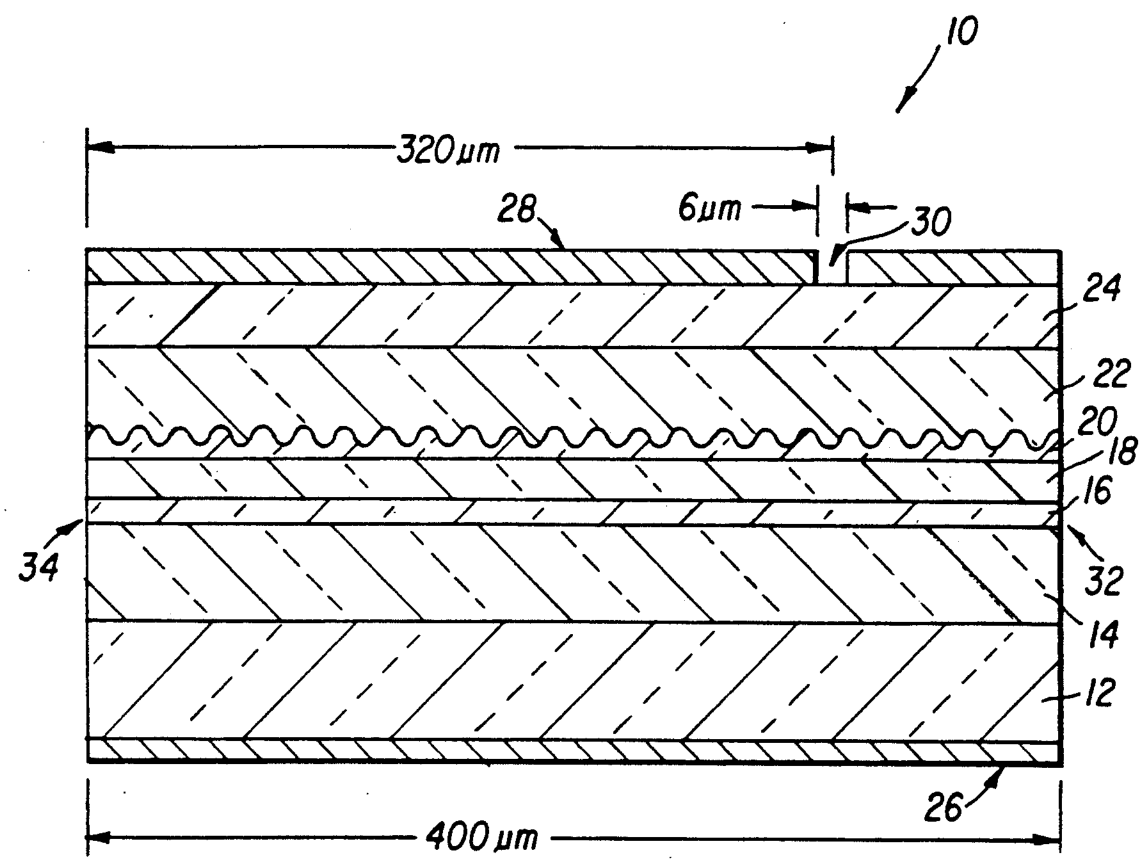
FIG. 3 depicts an embodiment of this invention.

FIG. 3 shows a particular realization of a DFB laser diode 10 in which a substrate 12 is highly doped n+-GaAs. In general, the substrate does not need to be composed of n+-GaAs. It can be composed of any highly conductive semiconductive material as long as the remaining layers can be grown epitaxially upon it. The remaining sections of the DFB laser diode are comprised of a series of individual semiconductive layers of predetermined thicknesses and doping types, arranged epitaxially on substrate 12, with ohmic metal contacts 26 and 28 located at the bottom and top of the DFB laser diode 10, respectively. The preferred embodiment is constructed so as to emit light through one of the end facet mirrors, 32 or 34, although other embodiments which emit radiation through the top of the DFB laser diode are possible. Light emission through the ohmic metal contact 28 is obtained by patterning the metal deposition on capping layer 24. Finally, the longitudinal length of the DFB laser diode is typically from 200 to 600 μm, and in the preferred embodiment, 400 μm.

Upon the n+-GaAs substrate 12 is grown the lower cladding layer 14, having a nominal thickness of 1.5 μm. In the preferred embodiment the lower cladding layer is comprised of n-type $Al_{0.35}Ga_{0.65}As$, although AlGaAs of other compositions and dopant types are possible. In addition, the lower cladding layer 14 can be formed from materials from other semiconductive systems, as long as they grow epitaxially on the substrate. The lower cladding layer 14 is doped n-type with materials, such as, Si or Sn, to a concentration from $10^{17}$ to $10^{19}$ atoms/cm$^3$, with a preferred density of $5\times10^{17}$ atoms cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy, Liquid Phase Epitaxy, or Atomic Layer Epitaxy) which accomplish epitaxial layers of controlled thicknesses and dopings, may be equally employed.

In an active layer 16, light is produced as a result of the recombination of electrons and holes injected from the lower and upper cladding layers, respectively. Typically, the active layer 16 is composed of GaAs, having thicknesses ranging from 100 to 2000 Å, preferably 1000 Å (bulk active layer), whose band gap is chosen to be smaller than that of the materials in the cladding layers, as is conventionally practiced. Typically, the nominal active layer thickness is chosen to be smaller, however, in order to maximize the effect of the lossy section, it is preferable to utilize a large active layer thickness, resulting in a larger unpumped active layer absorption loss. It should be noted that the active layer need not be composed of GaAs. It can be formed of any semiconductive material, such as InGaAs or AlGaAs, whose band gap is chosen to be smaller than that of the materials in the lower and upper cladding layers. In addition, instead of a single bulk layer, it can be composed of multiple quantum wells surrounded by confinement layers, whose band gaps are between those of the active and cladding layers, as is commonly practiced in the art. The preferred method of growth of the active layer is also MBE or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

Upon layer 16 is formed a barrier layer, 18, which typically has been employed so as to distance the grating layer from the active layer. In the preferred embodiment the barrier layer is 0.2 μm p-$Al_{0.40}Ga_{0.60}As$. Other compositions and material systems are possible as long as the layer can be grown epitaxially and its band gap is larger than that of the active and grating layers. The barrier layer is doped p-type with materials, such as, C, Be, or Zn, to a concentration from $10^{17}$ to $10^{19}$ atoms cm$^3$, with a preferred density of $1\times10^{17}$ atoms/cm$^3$.

Upon the barrier layer 18 is formed a grating layer 20. In the preferred embodiment the grating layer is 0.25 μm p-$Al_{0.20}Ga_{0.80}As$, where the grating itself is third order and 0.05 μm deep. Other compositions and material systems are possible as long as the layer can be grown epitaxially. As is common in the art, low-order gratings, typically second or third order, are defined holographically in photoresist, followed by ion milling or wet or dry chemical etching.

Figure 1:
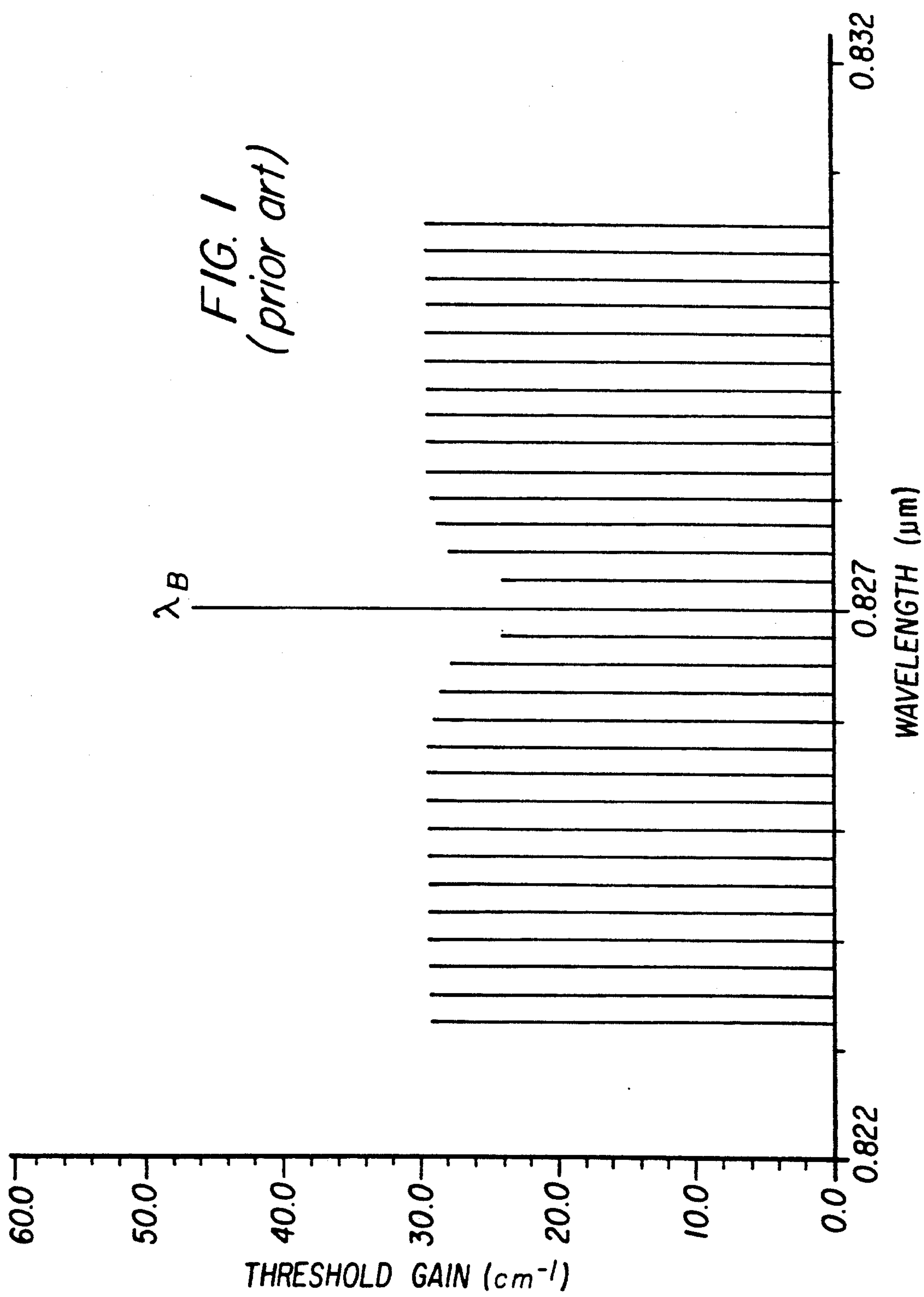
FIG. 1 shows a graph of gain as a function of wavelength for a prior art DFB laser diode.
Figure 2:
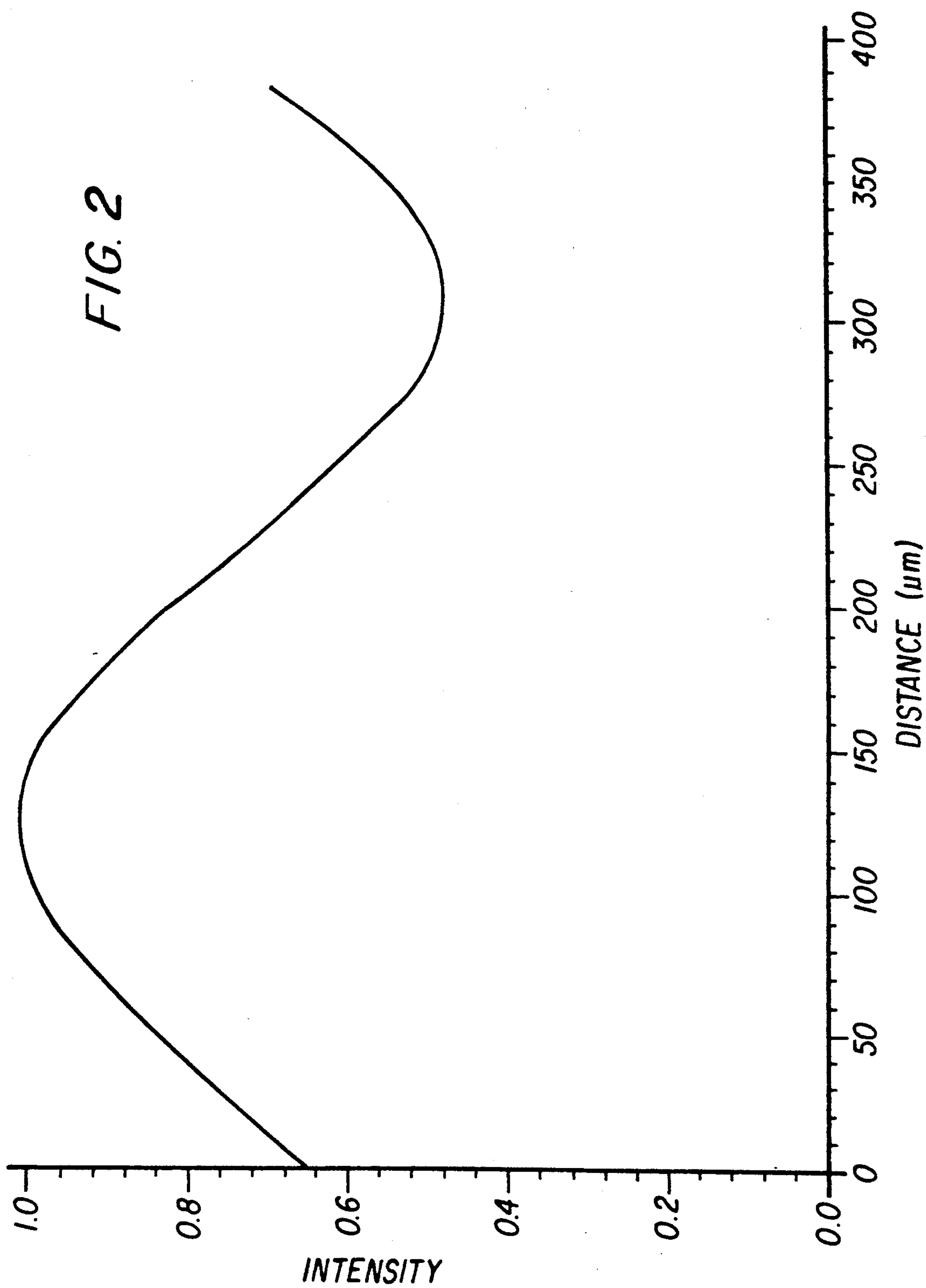
FIG. 2 is a graph of light intensity as a function of distance for the FIG. 3 embodiment.

A grating depth of 0.05 μm results in the $\kappa L$ coupling coefficient being on the order of 2. Other grating orders and depths can be used so as to modify the amount of feedback between the forward and backward propagating waves. As is well known, the formation of this grating layer results in the oscillation of the effective index of refraction along the laser diode cavity length, which produces an effective distributed mirror for modes adjacent to $\lambda_B$. Hence, for these modes, the modal reflectivity is determined by the distributed mirror and not by the end-facet mirrors. In this way the reflectivity of the distributed mirror can be designed to be greater than that of the end-facet mirrors, resulting in the lowering of the threshold gain for modes adjacent to $\lambda_B$, as shown in the FIG. 1 illustration.

On the surface of layer 20 is formed an upper cladding layer 22. For the preferred embodiment its composition is p-$Al_{0.40}Ga_{0.60}As$, having a thickness of 1.5 μm and a doping density of $2\times10^{17}$ atoms/cm$^3$. Other compositions and material systems are possible as long as the layer can be grown epitaxially. The upper cladding layer is grown over the grating following the etch step and special techniques, which are well-known in the art, need to be employed in order to obtain a defect-free overgrowth. Following 22 is formed a p-GaAs capping layer 24, which is typically 0.1 to 0.3 μm and preferrably is 0.2 μm. In order to provide electrical contact to the DFB laser diode, ohmic metals 26 and 28, such as Au-Ge-Ni and Au-Cr, respectively, are formed on the substrate and capping layers, respectively. It should be noted that the capping layer can also be n-type, if a Zn diffusion is employed to provide electrical contact from the ohmic metal 28 to the upper cladding layer, 22.

A lossy section 30 is formed by selectively interrupting the p-metal contact 28 for 6 μm on the top side of the DFB laser diode at a longitudinal position of 320 μm. The position and width of the lossy section have been chosen so as to maximize the threshold gain modulation depth. As a result of the very fast recombination times during stimulated emission, i.e., 0.1 psec, carriers on the edges of the lossy section are able to diffuse ~0.4 μm into that section before recombining. Consequently, the effective width of the lossy section is ~5 μm. Since the above values for the lossy section thickness and position were optimized for the particular DFB laser diode embodied by FIG. 3, it is important to modify these values for other DFB laser diode designs.

In general, semiconductor laser diodes operate effectively by confining the electron-hole and light-intensity distributions to the active layer. In addition to confinement in this, transverse, direction, confinement of both distributions in the perpendicular, lateral, direction is also preferred. This can be obtained by many different standard approaches, such as forming a channeled substrate planar structure in the substrate and lower cladding layers or by forming a rib waveguide structure in the capping and upper cladding layers. The former approach requires etching a trench in the substrate layer prior to growing the lower cladding layer, while the latter approach requires etching a mesa in the capping and upper cladding layers, following their deposition and prior to metal deposition. This additional confinement results mainly in lower threshold currents.

Thus, there is provided by the present invention a DFB laser diode that employs a selectively placed lossy section so as to obtain a strengthening of the threshold gain modulation depth. By virtue of the usage of the selectively placed lossy section in the structure, it becomes possible to discriminate more effectively between the Fabry-Perot and DFB modes, without the concomitant loss of laser diode performance or manufacturability, as associated with the prior art. The ability to increase the threshold gain modulation depth is highly desirable since it enables one to manufacture DFB laser diodes having better thermal stability.

ADVANTAGES

The usage of the selectively-placed lossy section enables one to obtain a significant improvement in the threshold gain modulation depth of typical DFB laser diodes with only a minimal change in the processing. In addition, this technique does not adversely affect the lifetime of the laser diode, nor substantially modify the output characteristics of the device, as do some of the processes employed in the prior art.

The invention has been described in detail with particular reference to certain preferred embodiments thereof, but it will be understood that variations and modifications can be effected within the spirit and scope of the invention.

What is claimed is:

1. A distributed-feedback semiconductor laser diode comprising:
   (a) a semiconductor substrate of a first conductivity type;
   (b) a lower cladding layer of such first conductivity type deposited on the semiconductor substrate;
   (c) a semiconductor active layer formed on the lower cladding layer;
   (d) a barrier layer of a second conductivity type deposited on the semiconductor active layer;
   (e) a grating layer of such second conductivity type deposited on the barrier layer;
   (f) an upper cladding layer of such second conductivity type deposited on the grating layer;
   (g) a capping layer of such second conductivity type formed on the upper cladding layer;
   (h) an electrically conductive layer formed on the substrate; and
   (i) a patterned electrically conductive layer deposited on the capping layer, selectively forming a lossy section, such that electrical contact is absent for a small longitudinal section of the capping layer.

2. The distributed-feedback semiconductor laser diode of claim 1 in which the conductivity of the substrate is either n- or p-type.

3. The distributed-feedback semiconductor laser diode of claim 1 in which the capping layer is n-type and zinc is diffused into the capping and upper cladding layers.

4. The distributed-feedback semiconductor laser diode of claim 1 in which lateral guiding is provided by a channeled-substrate-planar structure formed in the lower cladding and substrate layers.

5. The distributed-feedback semiconductor laser diode of claim 1 in which lateral guiding is provided by a rib waveguide structure formed in the capping and upper cladding layers.

6. The distributed-feedback semiconductor laser diode of claim 1 in which the semiconductor material system is AlGaAs.

7. The distributed-feedback semiconductor laser diode of claim 6 in which the semiconductor active layer is composed of InGaAs.

8. The distributed-feedback semiconductor laser diode of claim 5 in which the grating and barrier layers are formed adjacent to the active and lower cladding layers.

* * * * *